(12) United States Patent
Zhang et al.

(10) Patent No.: US 11,239,260 B2
(45) Date of Patent: Feb. 1, 2022

(54) SUBSTRATE FOR ELECTRONIC DEVICE, DISPLAY APPARATUS, METHOD OF FABRICATING SUBSTRATE FOR ELECTRONIC DEVICE

(71) Applicants: Hefei Xinsheng Optoelectronics Technology Co., Ltd., Anhui (CN); BOE Technology Group Co., Ltd., Beijing (CN)

(72) Inventors: Yang Zhang, Beijing (CN); Tongshang Su, Beijing (CN); Bin Zhou, Beijing (CN); Wei Li, Beijing (CN); Wei Song, Beijing (CN); Jun Liu, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 355 days.

(21) Appl. No.: 16/484,414

(22) PCT Filed: Oct. 12, 2018

(86) PCT No.: PCT/CN2018/110017
§ 371 (c)(1),
(2) Date: Aug. 7, 2019

(87) PCT Pub. No.: WO2020/073308
PCT Pub. Date: Apr. 16, 2020

(65) Prior Publication Data
US 2021/0335848 A1 Oct. 28, 2021

(51) Int. Cl.
H01L 27/12 (2006.01)
H01L 29/786 (2006.01)

(52) U.S. Cl.
CPC ........ *H01L 27/1251* (2013.01); *H01L 27/127* (2013.01); *H01L 27/1218* (2013.01); *H01L 27/1262* (2013.01); *H01L 29/786* (2013.01)

(58) Field of Classification Search
CPC ............. H01L 27/1251; H01L 27/1218; H01L 27/1262; H01L 27/127; H01L 27/786
See application file for complete search history.

(56) References Cited

U.S. PATENT DOCUMENTS 9,006,744 B2 * 4/2015 Lee ..................... H01L 29/4238
257/72
9,947,691 B2 * 4/2018 Jiang ................... H01L 29/7869
(Continued)

FOREIGN PATENT DOCUMENTS

CN 103367165 A 10/2013
CN 103809320 A 5/2014
(Continued)

OTHER PUBLICATIONS

International Search Report & Written Opinion dated Jul. 10, 2019, regarding PCT/CN2018/110017.
(Continued)

*Primary Examiner* — Mohsen Ahmadi
(74) *Attorney, Agent, or Firm* — Intellectual Valley Law, P.C.

(57) ABSTRACT

A substrate for an electronic device includes an insulating layer; a via extending into the insulating layer; a light shielding layer in the via; and a thin film transistor comprising an active layer on the light shielding layer and in the via. The light shielding layer is configured to shield light from irradiating on the active layer.

15 Claims, 10 Drawing Sheets

(56) References Cited

U.S. PATENT DOCUMENTS

| | | | |
|---|---|---|---|
| 2014/0008656 A1 | 1/2014 | Shim et al. | |
| 2014/0131713 A1 | 5/2014 | Lee et al. | |
| 2015/0179687 A1* | 6/2015 | Lee | H01L 29/78669 438/158 |
| 2015/0214254 A1 | 7/2015 | Yan et al. | |
| 2016/0342048 A1 | 11/2016 | Huang | |
| 2019/0207038 A1 | 7/2019 | Sun | |
| 2021/0167155 A1 | 6/2021 | Xu et al. | |

FOREIGN PATENT DOCUMENTS

| | | | |
|---|---|---|---|
| CN | 107302032 | A | 10/2017 |
| CN | 107507867 | A | 12/2017 |
| CN | 108573956 | A | 9/2018 |
| WO | 2018184403 | A1 | 10/2018 |

OTHER PUBLICATIONS

First Office Action in the Chinese Patent Application No. 201880001624.1, dated Jun. 4, 2021; English translation attached.

* cited by examiner

SUBSTRATE FOR ELECTRONIC DEVICE, DISPLAY APPARATUS, METHOD OF FABRICATING SUBSTRATE FOR ELECTRONIC DEVICE

CROSS-REFERENCE TO RELATED APPLICATION

This application is a national stage application under 35 U.S.C. § 371 of International Application No. PCT/CN2018/110017, filed Oct. 12, 2018, the contents of which are incorporated by reference in the entirety.

TECHNICAL FIELD

The present invention relates to display technology, more particularly, to a substrate for an electronic device, a display apparatus, and a method of fabricating a substrate for an electronic device.

BACKGROUND

Display devices such as liquid crystal display (LCD) and organic light-emitting diode (OLED) have been widely used. LCD and OLED display devices use thin film transistor (TFT) to control pixels in the display panel. Examples of TFT include amorphous silicon TFT, polycrystalline silicon TFT, single crystal silicon ITT, and metal oxide TFT. A thin film transistor may be classified into a top gate type or a bottom gate type.

SUMMARY

In one aspect, the present invention provides a substrate for an electronic device, comprising an insulating layer, a via extending into the insulating layer, a light shielding layer in the via; and a thin film transistor comprising an active layer on the light shielding layer and in the via; wherein the light shielding layer is configured to shield light from irradiating on the active layer.

Optionally, the thin film transistor further comprises a source electrode and a drain electrode respectively connected to the active layer; wherein at least a portion of the source electrode is in direct contact with the light shielding layer, at least a portion of the drain electrode is in direct contact with the light shielding layer; the source electrode, the drain electrode, and the light shielding layer form a light shielding structure configured to shield light from irradiating on the active layer.

Optionally, the source electrode comprises at least a first source electrode layer in direct contact with a first lateral side of the light shielding layer, the drain electrode comprises at least a first drain electrode layer in direct contact with a second lateral side of the light shielding layer; the first source electrode layer, the first drain electrode layer, and the light shielding layer constitute an integral structure.

Optionally, the thin film transistor further comprises a source electrode and a drain electrode respectively connected to the active layer; the source electrode comprises a first source electrode layer and a second source electrode layer; and the drain electrode comprises a first drain electrode layer and a second drain electrode layer.

Optionally, the first source electrode layer and the first drain electrode layer are respectively on the insulating layer, each of which at least partially inside the via; the second source electrode layer is on a side of the first source electrode layer distal to the insulating layer; and the second drain electrode layer is on a side of the first drain electrode layer distal to the insulating layer.

Optionally, the first source electrode layer, the first drain electrode layer, and the light shielding layer are in a same layer.

Optionally, the first source electrode layer, the first drain electrode layer, and the light shielding layer have a substantially same thickness.

Optionally, the active layer comprises a channel part, a source electrode contact part, and a drain electrode contact part; at least a portion of the source electrode contact part is on a side of the second source electrode layer distal to the first source electrode layer; and at least a portion of the drain electrode contact part is on a side of the second drain electrode layer distal to the first drain electrode layer.

Optionally, the first source electrode layer and the first drain electrode layer comprise a conductive material; and the light shielding layer comprises at least one element in common with the conductive material.

Optionally, the light shielding layer is converted from the conductive material by a plasma treatment, and patterns corresponding to the first source electrode layer, the first drain electrode layer, and the light shielding layer are formed in a single process.

Optionally, the first source electrode layer and the first drain electrode layer comprise a metallic material; the light shielding layer comprises an oxidative plasma-treated metallic material; the oxidative plasma-treated metallic material is an insulating material; and the first source electrode layer and the first drain electrode layer are insulated from each other.

Optionally, the oxidative plasma-treated metallic material comprises a substantially non-transparent insulating metal oxide material.

Optionally, the light shielding layer is in direct contact with at least a channel part of the active layer, and coven at least the channel part of the active layer.

Optionally, the substrate further comprises an insulating film between the active layer and the light shielding layer.

Optionally, each of the first source electrode layer and the first drain electrode layer comprises M1, M1 being a metal or an alloy; each of the second source electrode layer and the second drain electrode layer comprises M2, M2 being a metal or an alloy; and the light shielding layer comprises M1Ox, which is a substantially non-transparent insulating metal oxide material.

Optionally, M1 and M2 are the same.

Optionally, M1 comprises one or a combination of copper, silver, and manganese; and M2 comprises one or a combination of copper, silver, manganese, aluminum, molybdenum, chromium, neodymium, nickel, tantalum, and tungsten.

Optionally, the substrate is a display substrate comprising a plurality of subpixels; and an individual one of the plurality of subpixels comprises the thin film transistor and the light shielding layer.

In another aspect, the present invention provides a display apparatus comprising the display substrate described herein or fabricated by a method described herein.

In another aspect, the present invention provides a method of fabricating a substrate for an electronic device, comprising forming an insulating layer, forming a via extending into the insulating layer; forming a light shielding layer in the via; forming a thin film transistor; wherein forming the thin film transistor comprises forming an active layer on the light shielding layer and in the via; and the light shielding layer is formed to shield light from irradiating on the active layer.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a substrate for an electronic device, a display apparatus, and a method of fabricating a substrate for an electronic device that substantially obviate one or more of the problems due to limitations and disadvantages of the related art. In one aspect, the present disclosure provides a substrate for an electronic device. In some embodiments, the substrate for an electronic device includes an insulating layer; a via extending into the insulating layer; a light shielding layer in the via; and a thin film transistor comprising an active layer on the light shielding layer and in the via. Optionally, the light shielding layer is configured to shield light from irradiating on the active layer.

Figure 1:
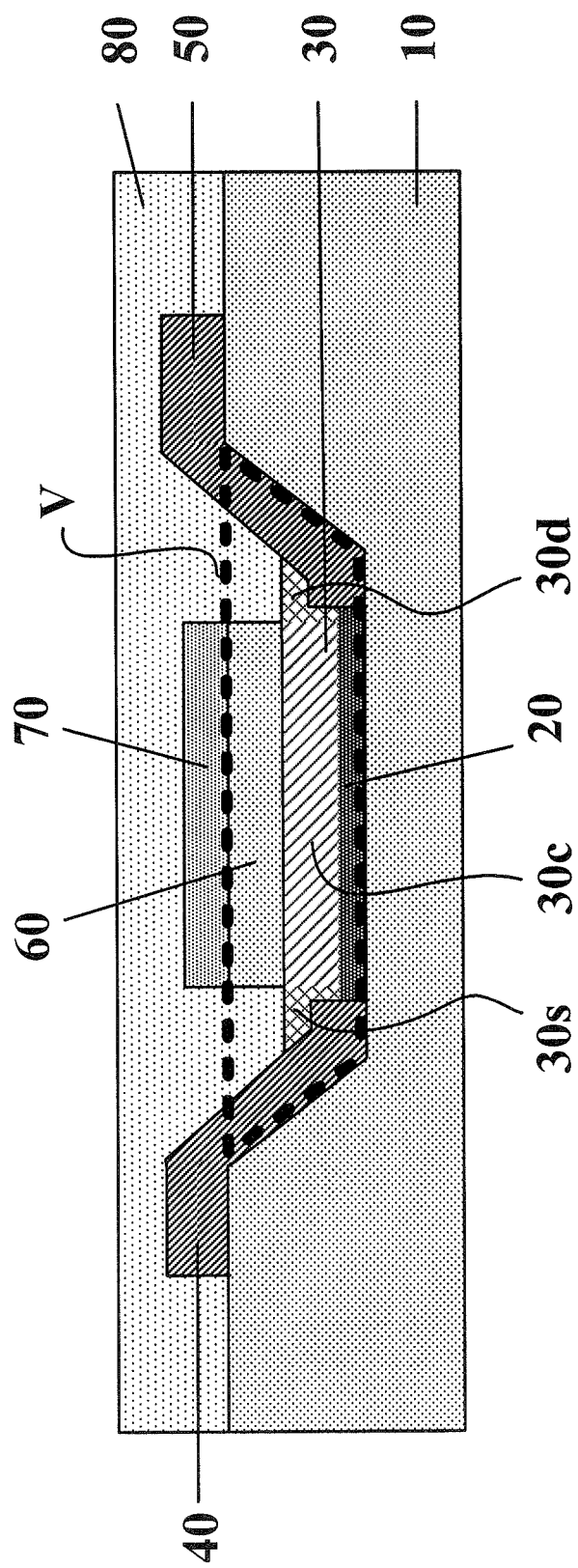
FIG. 1 is a schematic diagram illustrating the structure of a substrate for an electronic device in some embodiments according to the present disclosure.

FIG. 1 is a schematic diagram illustrating the structure of a substrate for an electronic device in some embodiments according to the present disclosure. Referring to FIG. 1, the substrate in some embodiments includes an insulating layer 10; a via V extending into the insulating layer 10; a light shielding layer 20 in the via; and a thin film transistor including an active layer 30, a gate insulating layer 60, a gate electrode 70, a source electrode 40, and a drain electrode 50. The active layer 30 is on the light shielding layer 20 and in the via V.

Optionally, the insulating layer 10 is a base substrate of the substrate. Optionally, and referring to FIG. 1, the via V partially extends into the insulating layer 10. Various appropriate semiconductor materials and various appropriate fabricating methods may be used to make the base substrate. Examples of appropriate materials for making the insulating layer 10 include glass, silicon, quartz, and flexible materials such as polyimide, polycarbonate, polyethersulfone, polyethylene terephthalate, polyethylene naphthalate, polyarylate, and fiber-reinforced plastic. Optionally, the base substrate is a transparent base substrate. By using the base substrate for forming the via V, the substrate can be made with a reduced thickness.

In some embodiments, the thin film transistor is a top gate-type thin film transistor. The gate insulating layer 60 is on a side of the active layer 30 distal to the light shielding layer 20, and the gate electrode 70 is on a side of the gate insulating layer 60 distal to the active layer 30. Optionally, the gate insulating layer 60 is at least partially in the via V, e.g., at least a bottom side of the gate insulating layer 60 is below a top side of the insulating layer 10. Optionally, the gate insulating layer 60 is outside the via V, e.g., a bottom side of the gate insulating layer 60 is above a top side of the insulating layer 10. Optionally, the gate insulating layer 60 is at least partially outside the via V, e.g., at least a top side of the gate insulating layer 60 is above a top side of the insulating layer 10. Optionally, the gate electrode 70 is at least partially in the via V, e.g., at least a bottom side of the gate electrode 70 is below a top side of the insulating layer 10. Optionally, the gate electrode 70 is outside the via V, e.g., a bottom side of the gate electrode 70 is above a top side of the insulating layer 10. Optionally, the gate electrode 70 is at least partially outside the via V, e.g., at least a top side of the gate electrode 70 is above a top side of the insulating layer 10. Referring to FIG. 1, the terms "top side" and "bottom side" are relative terms with respect to the insulating layer 10. For example, a top side and a bottom side of a layer are two opposite sides of the layer, the top side of the layer is a side facing away the insulating layer 10 or the light shielding layer 20, and the bottom side of the layer is a side facing the insulating layer 10 or the light shielding layer 20.

The source electrode 40 and the drain electrode 50 are at least partially in the via V. Optionally, the source electrode 40 extends from a region outside the via V into a region inside the via V. Optionally, the drain electrode 50 extends from a region outside the via V into a region inside the via V.

In some embodiments, the active layer 30 includes a channel part 30c, a source electrode contact part 30s, and a drain electrode contact part 30d. The active layer 30 is electrically connected to the source electrode 40 through the source electrode contact part 30s, and is electrically connected to the drain electrode 50 through the drain electrode contact part 30d. The light shielding layer 20 covers at least the channel part 30c of the active layer 30. For example, an orthographic projection of the light shielding layer 20 on the insulating layer 10 substantially covers an orthographic projection of the channel part 30c of the active layer 30 on the insulating layer 10.

In some embodiments, the source electrode 40, the drain electrode 50, and the light shielding layer 20 form a light shielding structure configured to shield light from irradiating on the active layer. Referring to FIG. 1, at least a portion of the source electrode 40 is in direct contact with a first lateral side (e.g., a left lateral side) of the light shielding layer 20, and at least a portion of the drain electrode 50 is in direct contact with a second lateral side (e.g., a right lateral side) of the light shielding layer 20. The active layer 30 is on the light shielding layer 20. Thus, the unique light shielding structure formed by the source electrode 40, the drain electrode 50, and the light shielding layer 20 is configured to shield, not only light from a bottom side of the active layer 30, but also light irradiated from lateral sides, from irradiating on the active layer 30.

In some embodiments, the light shielding layer 20 is in direct contact with (e.g., without any intervening structure or layer there-between) the active layer 30, e.g., in direct contact with the channel part 30c of the active layer 30. By having the light shielding layer 20 in direct contact with the active layer 30, the light shielding layer 20 can be more effective in shielding light from irradiating on the active layer 30. For example, in a conventional substrate having a thin film transistor, the light shielding layer is typically spaced apart from the active layer by a buffer layer. In the conventional substrate, the light shielding layer is capable of shielding external ambient light, however, light inside the substrate and reflected by metal traces and metal layers can still irradiate on the active layer due to the presence of the buffer layer spacing apart the active layer from the light shielding layer, leading to instability of the performance of the thin film transistor. The issue becomes particularly problematic when the display panel has a high distribution density of metal traces, for example, in a large size organic light emitting diode display panel. By having the light shielding layer 20 in direct contact with the active layer 30, the active layer 30 can be completely shielded from external and internal light, considerably enhancing the performance and stability of the thin film transistor.

In the conventional substrate, the light shielding layer is typically made of a metallic material, resulting in a double-gate structure of the thin film transistor. The capacitance coupling effect between the light shielding layer and the electrode(s) of the thin film transistor sometimes can severely affect the performance of the thin film transistor. In the substrate according to the present disclosure, the light shielding layer in some embodiments includes a substantially non-transparent insulating material. Thus, the double-gate structure can be avoided in the present substrate, significantly enhancing the performance of the thin film transistor.

Figure 2:
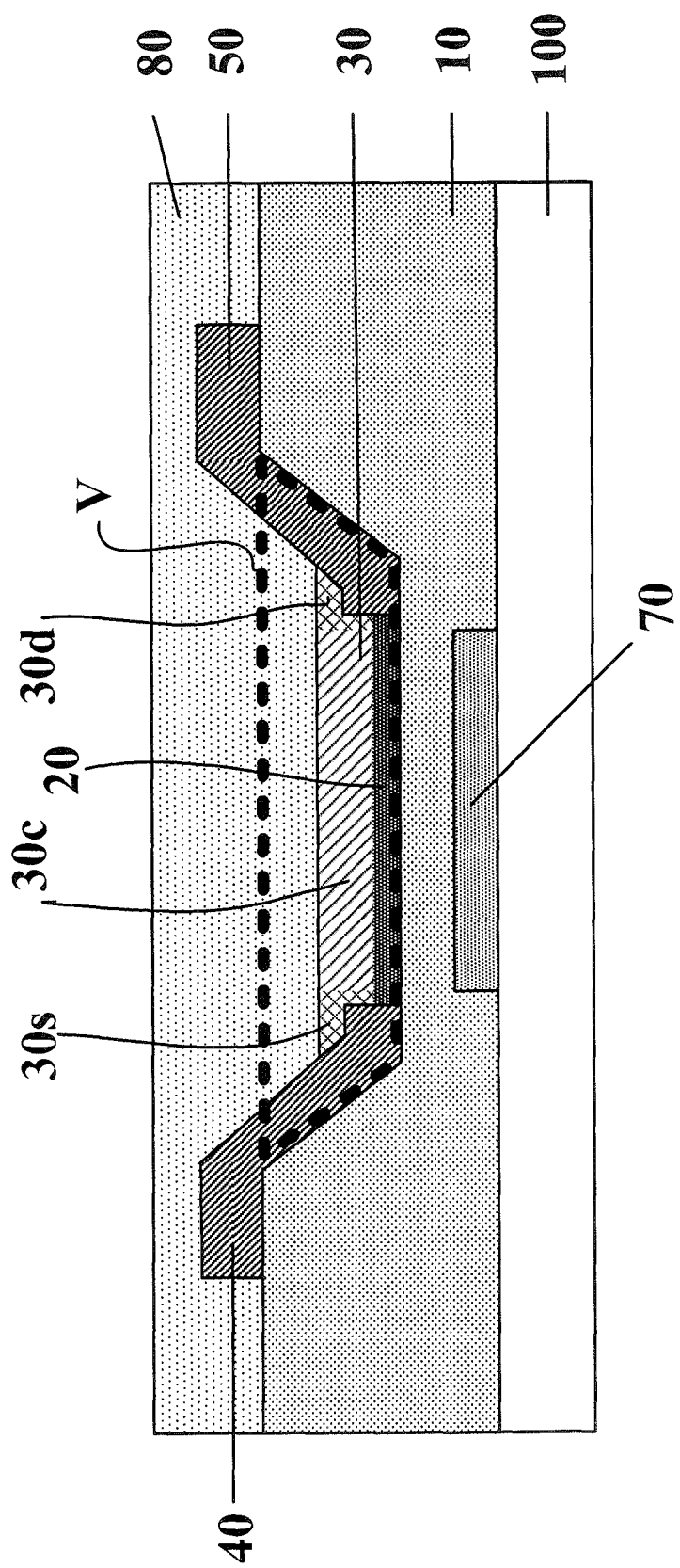
FIG. 2 is a schematic diagram illustrating the structure of a substrate for an electronic device in some embodiments according to the present disclosure.

FIG. 2 is a schematic diagram illustrating the structure of a substrate for an electronic device in some embodiments according to the present disclosure. Referring to FIG. 2, the thin film transistor in some embodiments is a bottom gate-type thin film transistor. The substrate further includes a base substrate 100, and a gate electrode 70 on the base substrate 100. The insulating layer 10 is on a side of the gate electrode 70 distal to the base substrate 100, and the insulating layer 10 functions as a gate insulating layer of the thin film transistor. The via V extends into the insulating layer 10. The light shielding layer 20 is on a side of the insulating layer 10 distal to the gate electrode 70, and the active layer 30 is on a side of the light shielding layer 20 distal to the gate electrode 70.

Various appropriate insulating materials and various appropriate fabricating methods may be used to make the insulating layer 10. For example, an insulating material may be deposited on the substrate by a plasma-enhanced chemical vapor deposition (PECVD) process. Examples of appropriate insulating materials for making the insulating layer 10 include, but are not limited to, acrylic materials, silicon oxide ($SiO_y$), silicon nitride ($SiN_y$, e.g., $Si_3N_4$), silicon oxynitride ($SiO_xN_y$), polyimide and other over coating materials.

Various appropriate semiconductor materials and various appropriate fabricating methods may be used to make the active layer 30. For example, a semiconductor material may be deposited on the substrate by a plasma-enhanced chemical vapor deposition (PECVD) process and patterned. Examples of appropriate semiconductor materials for making the active layer 30 includes, but are not limited to, metal oxides (e.g., ITO, IZTO, IGTO), amorphous silicon, polycrystalline silicon, single crystal silicon, organic semiconductor materials, and the like. Optionally, the semiconductor materials may be partially or entirely doped by one or more metal elements, one or more non-metal element, or a combination thereof.

Various appropriate electrode materials and various appropriate fabricating methods may be used to make the gate electrode 70, the source electrode 40, and the drain electrode 50. For example, an electrode material may be deposited on the substrate by a plasma-enhanced chemical vapor deposition (PECVD) process and patterned. Examples of appropriate electrode materials for making the gate electrode 70, the source electrode 40, and the drain electrode 50, include, but are not limited to, carbon nanotubes, graphene, conductive resins, various metals and alloys such as aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like.

Referring to FIG. 1 and FIG. 2, the substrate in some embodiments further includes a passivation layer 80 on a side of the source electrode 40 and the drain electrode 50 distal to the insulating layer 10. Various appropriate insulating materials and various appropriate fabricating methods may be used to make the passivation layer 80. For example, an insulating material may be deposited on the substrate by a plasma-enhanced chemical vapor deposition (PECVD) process. Examples of appropriate insulating materials for making the passivation layer 80 include, but are not limited to, silicon oxide ($SiO_y$), silicon nitride ($SiN_y$, e.g., $Si_3N_4$), and silicon oxynitride ($SiO_xN_y$).

Figure 3:
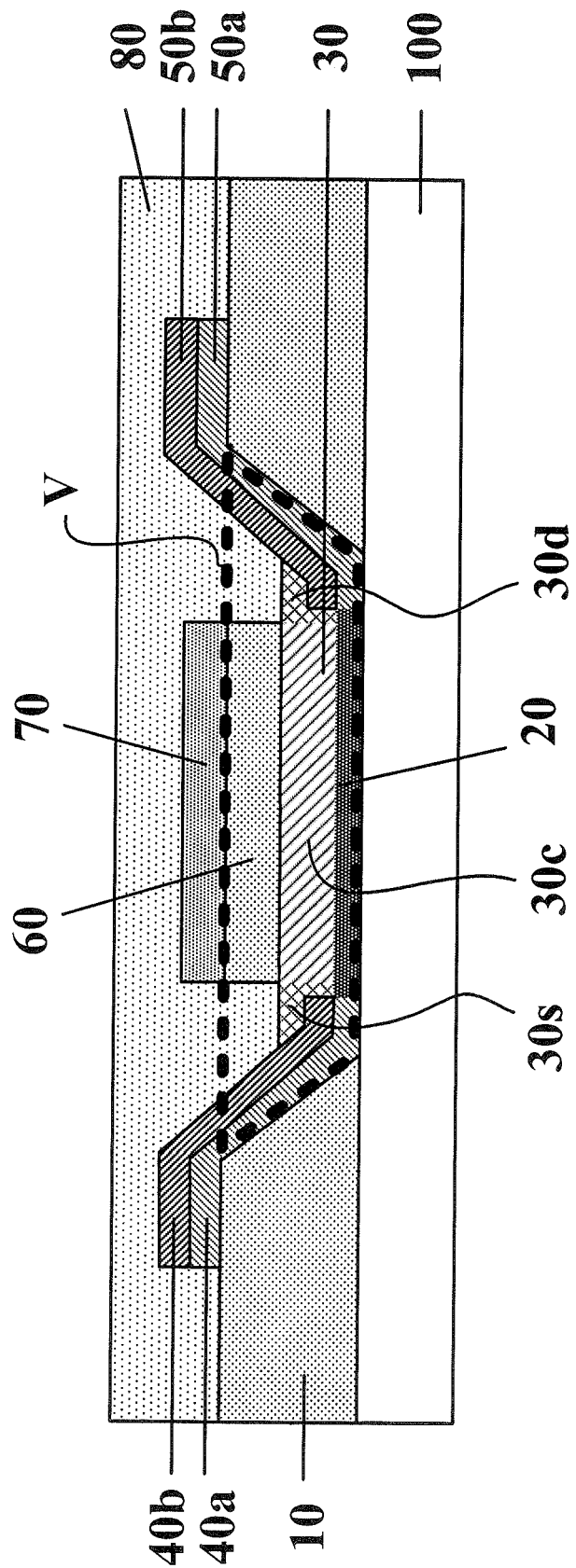
FIG. 3 is a schematic diagram illustrating the structure of a substrate for an electronic device in some embodiments according to the present disclosure.

FIG. 3 is a schematic diagram illustrating the structure of a substrate for an electronic device in some embodiments according to the present disclosure. Referring to FIG. 3, the source electrode in some embodiments includes a first source electrode layer 40a and a second source electrode layer 40b, and the drain electrode in some embodiments includes a first drain electrode layer 50a and a second drain electrode layer 50b. The first source electrode layer 40a and the first drain electrode layer 50a are respectively on the insulating layer 10, each of which at least partially inside the via V. As shown in FIG. 3, the via V optionally extends through the insulating layer 10. The second source electrode layer 40b is on a side of the first source electrode layer 40a distal to the insulating layer 10. The second drain electrode layer 50b is on a side of the first drain electrode layer 50a distal to the insulating layer 10.

In some embodiments, the source electrode 40, the drain electrode 50, and the light shielding layer 20 form a light shielding structure configured to shield light from irradiating on the active layer. Referring to FIG. 3, at least the first source electrode layer 40a is in direct contact with a first lateral side (e.g., a left lateral side) of the light shielding layer 20, and at least the first drain electrode layer 50a is in direct contact with a second lateral side (e.g., a right lateral side) of the light shielding layer 20. Optionally, the first source electrode layer 40a, the first drain electrode layer 50a, and the light shielding layer 20 constitute an integral structure. The active layer 30 is on the light shielding layer 20. Thus, the unique light shielding structure formed by the source electrode 40, the drain electrode 50, and the light shielding layer 20 is configured to shield, not only light from a bottom side of the active layer 30, but also light irradiated from lateral sides, from irradiating on the active layer 30.

In some embodiments, the first source electrode layer 40a is on the insulating layer 10, extending from a region outside the via V into a region inside the via V; the first drain electrode layer 50a is on the insulating layer 10, extending from the region outside the via V into the region inside the via V. In some embodiments, the second source electrode layer 40b is on a side of the first source electrode layer 40a distal to the insulating layer 10, extending from the region outside the via V into the region inside the via V; the second drain electrode layer 50b is on a side of the first drain electrode layer 50a distal to the insulating layer 10, extending from the region outside the via V into the region inside the via V.

In some embodiments, the first source electrode layer 40a, the first drain electrode layer 50a, and the light shielding layer 20 are in a same layer, e.g., include a same material, and fabricated in a single patterning process using a same mask plate. As used herein, the term "same layer" refers to the relationship between the layers simultaneously formed in a same step. In one example, the first source electrode layer 40a, the first drain electrode layer 50a, and the light shielding layer 20 are in a same layer when they are formed as a result of one or more steps of a same patterning process performed in a same layer of material. In another example, the first source electrode layer 40a, the first drain electrode layer 50sa, and the light shielding layer 20 can be formed in a same layer by simultaneously performing the step of forming the first source electrode layer 40a, the step of forming the first drain electrode layer 50a, and the step of forming the light shielding layer 20. The term "same layer" does not always mean that the thickness of the layer or the height of the layer in a cross-sectional view is the same.

Referring to FIG. 3, in some embodiments, because the first source electrode layer 40a, the first drain electrode layer 50a, and the light shielding layer 20 are in a same layer, the three layers have approximately a same thickness. Optionally, the thickness of each of the first source electrode layer 40a, the first drain electrode layer 50a, and the light shielding layer 20 is in a range of approximately 100 nm to approximately 600 nm, e.g., approximately 100 nm to approximately 200 nm, approximately 200 nm to approximately 300 nm, approximately 300 nm to approximately 400 nm, approximately 400 nm to approximately 500 nm, and approximately 500 nm to approximately 600 nm.

Optionally, the thickness of each of the second source electrode layer 40b and the second drain electrode layer 50b is in a range of approximately 100 nm to approximately 600 nm, e.g., approximately 100 nm to approximately 200 nm, approximately 200 nm to approximately 300 nm, approximately 300 nm to approximately 400 nm, approximately 400 nm to approximately 500 nm, and approximately 500 nm to approximately 600 nm.

Various appropriate electrode materials and various appropriate fabricating methods may be used to make the first source electrode layer 40a and the first drain electrode layer 50a. For example, an electrode material may be deposited on the substrate by a plasma-enhanced chemical vapor deposition (PECVD) process and patterned. Examples of appropriate electrode materials for making the first source electrode layer 40a and the first drain electrode layer 50a, include, but are not limited to, various metals and alloys such as copper, silver, manganese, aluminum, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, each of the first source electrode layer 40a and the first drain electrode layer 50a includes one or a combination of copper, silver, and manganese.

Various appropriate electrode materials and various appropriate fabricating methods may be used to make the second source electrode layer 40b and the second drain electrode layer 50b. For example, an electrode material may be deposited on the substrate by a plasma-enhanced chemical vapor deposition (PECVD) process and patterned. Examples of appropriate electrode materials for making the second source electrode layer 40b and the second drain electrode layer 50b, include, but are not limited to, various metals and alloys such as copper, silver, manganese, aluminum, molybdenum, chromium, neodymium, nickel, tantalum, tungsten, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, each of the second source electrode layer 40b and the second drain electrode layer 50b includes one or a combination of copper, silver, manganese, aluminum, molybdenum, chromium, neodymium, nickel, tantalum, and tungsten.

Optionally, the first source electrode layer 40a, the first drain electrode layer 50a, the second source electrode layer 40b, and the second drain electrode layer 50b are made of a same material.

Optionally, each of the first source electrode layer and the first drain electrode layer includes M1, M1 being a metal or an alloy. Optionally, each of the second source electrode layer and the second drain electrode layer includes M2, M2 being a metal or an alloy. Optionally, M1 and M2 are the same. Optionally, M1 and M2 are different from each other.

Various appropriate electrode materials and various appropriate fabricating methods may be used to make the light shielding layer 20. For example, a light shielding material may be deposited on the substrate by a plasma-enhanced chemical vapor deposition (PECVD) process and patterned. In some embodiments, the light shielding layer 20 may be an insulating, substantially non-transparent material converted from a conductive material. As used herein, the term "substantially non-transparent" means at least 50 percent (e.g., at least 60 percent, at least 70 percent, at least 80 percent, at least 90 percent, and at least 95 percent) of light in the visible wavelength range being blocked and not transmitted through the light shielding layer 20.

In some embodiments, the light shielding layer 20 includes at least one element in common with the metallic material of the first source electrode layer 40a and the first drain electrode layer 50a, e.g., the light shielding layer 20 includes at least M1, M1 being a metal or an alloy. In some embodiments, the light shielding layer 20 is formed by treating a conductive material with an oxidative treatment. Optionally, the light shielding layer includes M1Ox, which is a substantially non-transparent insulating metal oxide material. In some embodiments, the light shielding layer 20 is formed by treating the conductive material with a plasma treatment, and patterns corresponding to the first source electrode layer 40a, the first drain electrode layer 50a, and the light shielding layer 20 are formed in a single process. Optionally, the first source electrode layer 40a and the first drain electrode layer 50a includes a metallic material, the light shielding layer 20 includes an oxidative plasma-treated metallic material, and the oxidative plasma-treated metallic material is an insulating material. In the present disclosure, the source electrode and the drain electrode are insulated from each other. For example, the first source electrode layer 40a and the first drain electrode layer 50a are insulated from each other, and the second source electrode layer 40b and the second drain electrode layer 50b are insulated from each other. Various appropriate implementations may be practiced to ensure the insulation between the source electrode and the drain electrode. Optionally, the light shielding layer 20 is spaced apart from the first source electrode layer 40a and the first drain electrode layer 50a (and is also spaced apart from the second source electrode layer 40b and the second drain electrode layer 50b), and is insulating at least in portions in contact with the active layer. Optionally, an entirety of the light shielding layer 20 is insulating. In one example, the entirety of the light shielding layer 20 is insulating, and the light shielding layer 20 is connected to the first source electrode layer 40a and the first drain electrode layer 50a (e.g., as an integral layer), and the first source electrode layer 40a and the first drain electrode layer 50a are insulated from each other by the light shielding layer 20. Optionally, the oxidative plasma-treated metallic material includes a substantially non-transparent insulating metal oxide material. Optionally, the light shielding layer 20 is in direct contact with at least a channel part 30c of the active layer 30, and covers at least the channel part 30c of the active layer 30. Optionally, the light shielding layer 20 is in direct contact with the channel part 30c, the source electrode contact part 30s, and the drain electrode contact part 30d of the active layer 30, and covers the channel part 30c, the source electrode contact part 30s, and the drain electrode contact part 30d of the active layer 30.

Referring to FIG. 3, the active layer 30 includes a channel part 30c, a source electrode contact part 30s, and a drain electrode contact part 30d. In some embodiments, at least a portion of the source electrode contact part 30s is on a side of the second source electrode layer 40b distal to the first source electrode layer 40a, and at least a portion of the drain electrode contact part 30d is on a side of the second drain electrode layer 50b distal to the first drain electrode layer 50a. By having this design, the contact between the active layer 30 and the source electrode, and the contact between the active layer 30 and the drain electrode, can be effectively enhanced.

Figure 4:
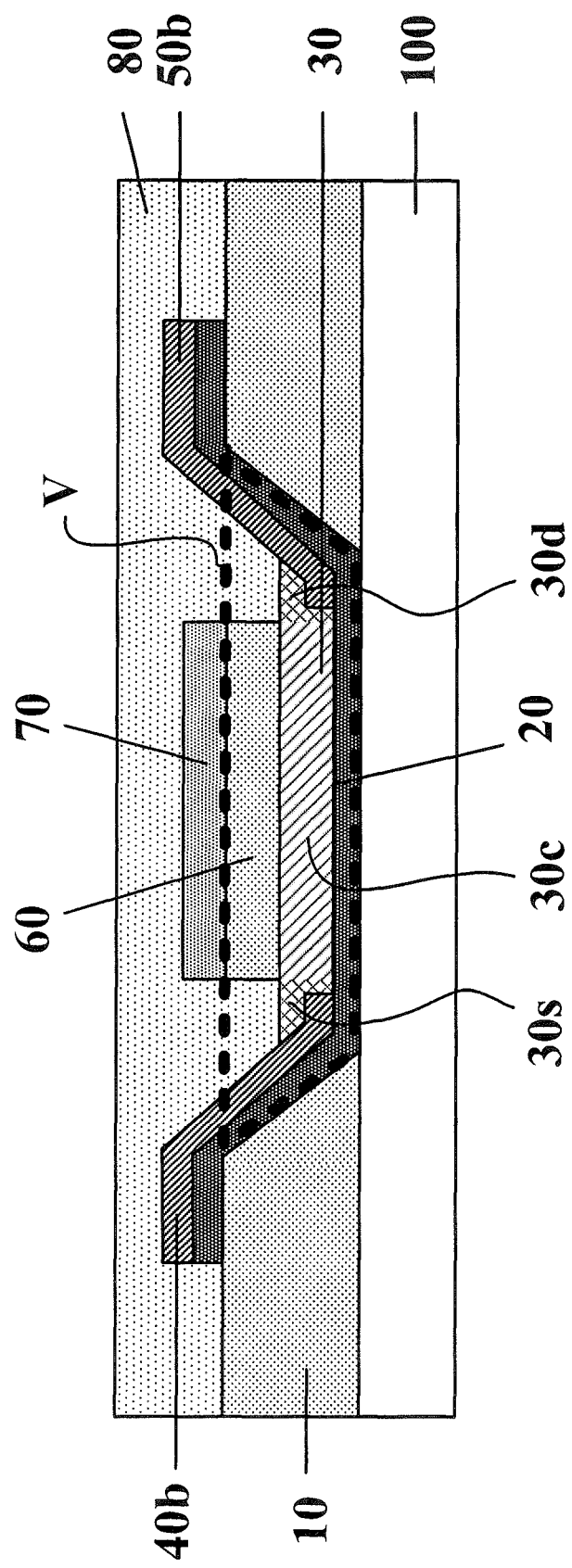
FIG. 4 is a schematic diagram illustrating the structure of a substrate for an electronic device in some embodiments according to the present disclosure.

FIG. 4 is a schematic diagram illustrating the structure of a substrate for an electronic device in some embodiments according to the present disclosure. Referring to FIG. 4, the source electrode in some embodiments includes only a single layer, i.e., a second source electrode layer 40b, but not a first source electrode layer, and the drain electrode in some embodiments includes only a single layer, i.e., a second drain electrode layer 50, but not a first drain electrode layer. The light shielding layer 20 is substantially co-extensive with a combination of the source electrode (i.e., the second source electrode layer 401), the active layer 30, and the drain electrode (i.e., the second drain electrode layer 5b). Optionally, an orthographic projection of the light shielding layer 20 on the base substrate 100 substantially overlaps with a combination of orthographic projections of the second source electrode layer 40b, the active layer 30, and the second drain electrode layer 50 on the base substrate 100. As used herein, the term "substantially overlap" refers to two orthographic projections at least 50%, e.g., at least 60%, at least 70%, at least 80%, at least 90%, at least 95%, at least 99%, overlapping with each other. Optionally, the orthographic projection of the light shielding layer 20 on the base substrate 100 completely overlaps with the combination of the orthographic projections of the second source electrode layer 40b, the active layer 30, and the second drain electrode layer 50b on the base substrate 100.

Referring to FIG. 4, the active layer 30 includes a channel part 30c, a source electrode contact part 30s, and a drain electrode contact part 30d. In some embodiments, at least a portion of the source electrode contact part 30s is on a side of the second source electrode layer 40b distal to the light shielding layer 20, and at least a portion of the drain electrode contact part 30d is on a side of the second drain electrode layer 50b distal to the light shielding layer 20. By having this design, the contact between the active layer 30 and the source electrode, and the contact between the active layer 30 and the drain electrode, can be effectively enhanced.

Referring to FIG. 4, in some embodiments, the light shielding layer 20 form a light shielding structure configured to shield, not only light from a bottom side of the active layer 30, but also light irradiated from lateral sides, from irradiating on the active layer 30.

Figure 5:
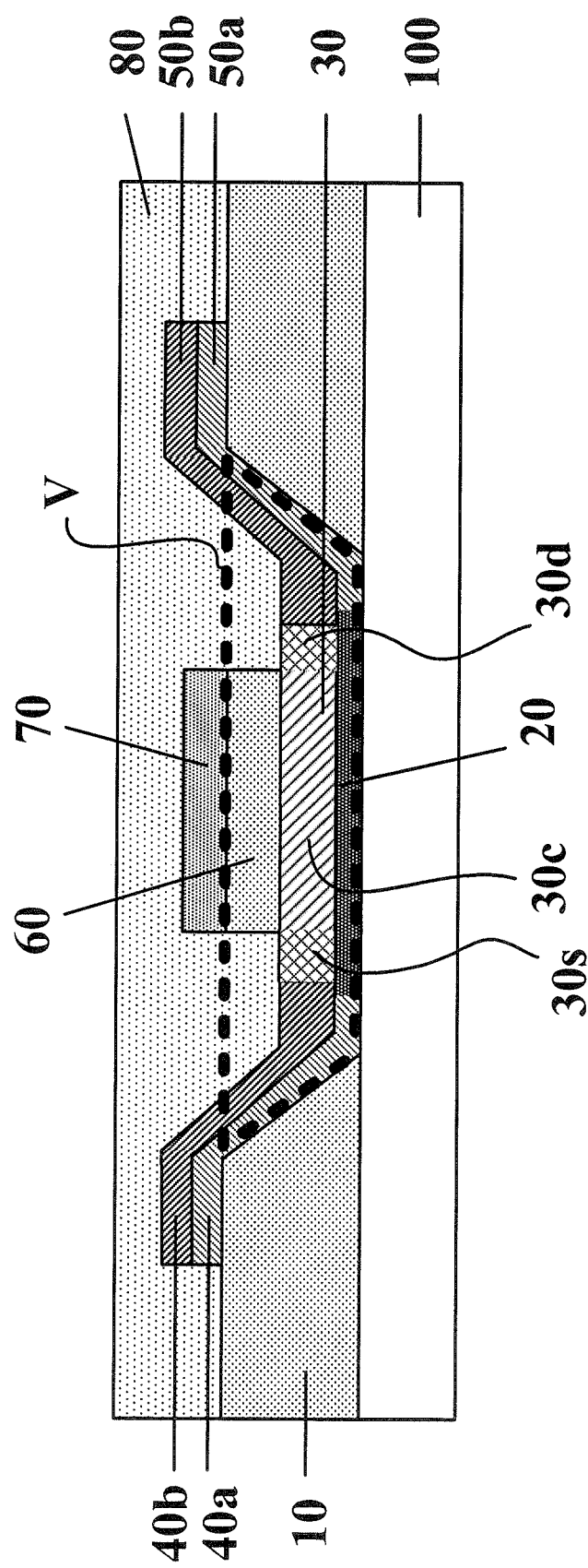
FIG. 5 is a schematic diagram illustrating the structure of a substrate for an electronic device in some embodiments according to the present disclosure.

FIG. 5 is a schematic diagram illustrating the structure of a substrate for an electronic device in some embodiments according to the present disclosure. Referring to FIG. 5, the source electrode contact part 30s of the active layer 30 is in contact with a lateral side of the second source electrode layer 40b, and the drain electrode contact part 30d of the active layer 30 is in contact with a lateral side of the second drain electrode layer 50b. Optionally, the active layer 30, the second source electrode layer 40b, and the second drain electrode layer 50b have a substantially same thickness. Optionally, the thickness of each of the active layer 30, the second source electrode layer 40b, and the second drain electrode layer 50b is in a range of approximately 100 nm to approximately 600 nm, e.g., approximately 100 nm to approximately 200 nm, approximately 200 nm to approximately 300 nm, approximately 300 nm to approximately 400 nu, approximately 400 nm to approximately 500 nm, and approximately 500 nm to approximately 600 nm.

Figure 6:
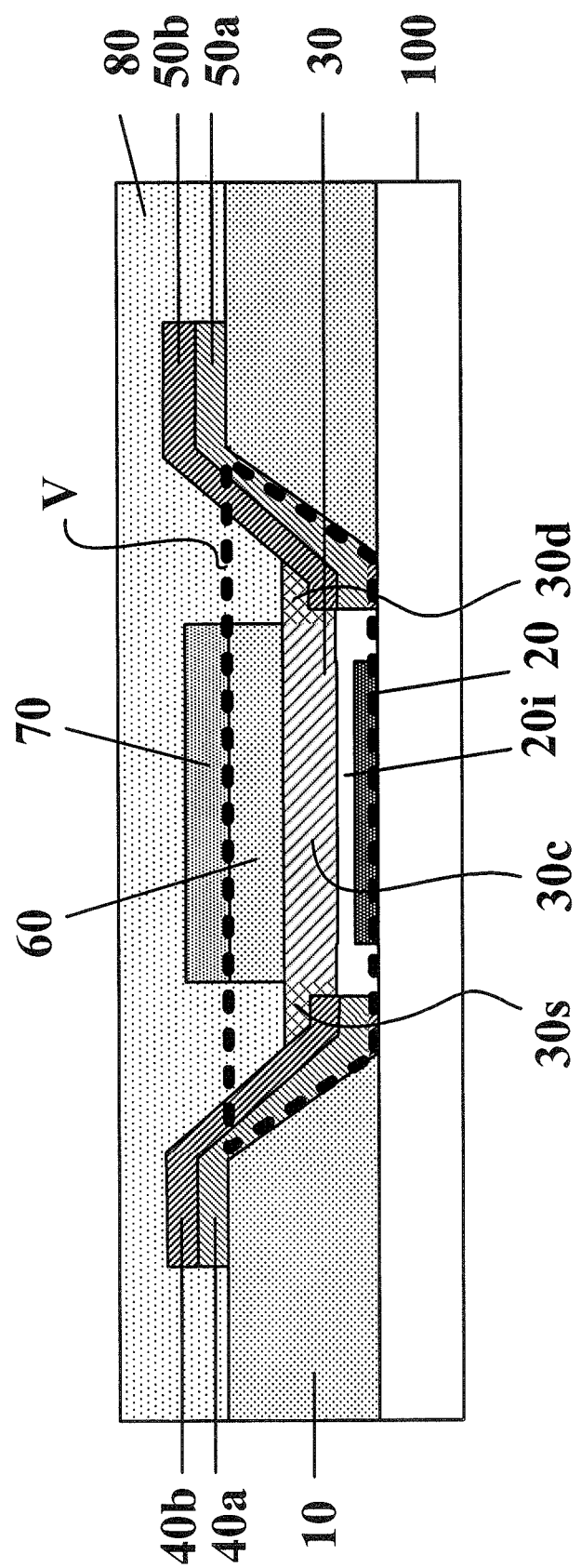
FIG. 6 is a schematic diagram illustrating the structure of a substrate for an electronic device in some embodiments according to the present disclosure.

FIG. 6 is a schematic diagram illustrating the structure of a substrate for an electronic device in some embodiments according to the present disclosure. Referring to FIG. 6, the substrate in some embodiments further includes an insulating film 20i between the active layer 30 (e.g., at least the channel part 30c of the active layer 30) and the light shielding layer 20. By forming an insulating film 20i between the active layer 30 and the light shielding layer 20, the stability of the thin film transistor can be enhanced. Optionally, as shown in FIG. 6, the light shielding layer 20 is spaced apart from the first source electrode layer 40a and the first drain electrode layer 50a (for example, by the insulating film 20i). Optionally, the light shielding layer 20 is in contact with the first source electrode layer 40a and the first drain electrode layer 50a, however, an entirety of the light shielding layer 20 is insulating.

In some embodiments, the substrate is a display substrate, e.g., an array substrate of a display panel having an array of a plurality of thin film transistor, each of which is a thin film transistor described herein (e.g., the thin film transistor described in FIGS. 1 to 6). The display substrate in some embodiments further includes a plurality of gate lines and a plurality of data lines for driving image display in the array substrate. The source electrode of each of the plurality of thin film transistor is connected to one of the plurality of data lines, the gate electrode of each of the plurality of thin film transistor is connected to one of the plurality of gate lines. Optionally, the drain electrode of each of the plurality of thin film transistor is connected to a pixel electrode. Optionally, the display substrate is a liquid crystal display substrate. Optionally, the display substrate is an organic light emitting diode display substrate. Optionally, the display substrate is an electrophoretic display substrate. Optionally, the display substrate is a touch control substrate. The display substrate has a plurality of subpixels, each of which including the thin film transistor described herein (e.g., the thin film transistor described in FIGS. 1 to 6).

In another aspect, the present disclosure provides a display panel having the display substrate described herein or fabricated by a method described herein.

In another aspect, the present disclosure provides a display apparatus having a display panel described herein, or having a display substrate described herein or fabricated by a method described herein. Optionally, the display apparatus is a liquid crystal display apparatus. Optionally, the display apparatus is an organic light emitting diode display apparatus. Optionally, the display apparatus is an electrophoretic display apparatus. In some embodiments, the display apparatus includes a plurality of subpixels arranged in an array having a plurality of rows and a plurality of columns. Optionally, each of the plurality of subpixels includes at least one thin film transistor described herein or fabricated by a method described herein. Examples of appropriate display apparatuses include, but are not limited to, an electronic paper, a mobile phone, a tablet computer, a television, a monitor, a notebook computer, a digital album, a GPS, etc.

In another aspect, the present disclosure provides a method of fabricating a substrate for an electronic device. In some embodiments, the method includes forming an insulating layer; forming a via extending into the insulating layer; forming a light shielding layer in the via; and forming a thin film transistor. In some embodiments, the step of forming the thin film transistor includes forming an active layer on the light shielding layer and in the via. The light shielding layer is formed to shield light from irradiating on the active layer. Optionally, the step of forming the thin film transistor further includes forming a source electrode and a drain electrode respectively connected to the active layer.

In some embodiments, the step of forming the source electrode includes forming a first source electrode layer and forming a second source electrode layer, and the step of forming the drain electrode includes forming a first drain electrode layer and forming a second drain electrode layer. Optionally, the first source electrode layer and the first drain electrode layer are respectively formed on the insulating layer, each of which is formed at least partially inside the via. Optionally, the second source electrode layer is formed on a side of the first source electrode layer distal to the insulating layer. Optionally, the second drain electrode layer is formed on a side of the first drain electrode layer distal to the insulating layer.

In some embodiments, the first source electrode layer, the first drain electrode layer, and the light shielding layer are formed in a same layer, e.g., using a same material, and formed in a single patterning process using a same mask plate. Optionally, the first source electrode layer, the first drain electrode layer, and the light shielding layer are formed to have a substantially same thickness.

In some embodiments, the active layer is formed to include a channel part, a source electrode contact part, and a drain electrode contact part. Optionally, the source electrode contact part and the drain electrode contact part are formed so that at least a portion of the source electrode contact part is on a side of the second source electrode layer distal to the first source electrode layer, and at least a portion of the drain electrode contact part is on a side of the second drain electrode layer distal to the first drain electrode layer.

In some embodiments, the first source electrode layer and the first drain electrode layer are made of a conductive material, and light shielding layer is made of a material having at least one element in common with the conductive material.

In some embodiments, the steps of forming the first source electrode layer, the first drain electrode layer, and the light shielding layer includes forming a conductive material layer, converting a portion of the conductive material layer corresponding to the channel part of the active layer to be formed into the light shielding layer, thereby forming the first source electrode layer and the first drain electrode layer, which are portions of the conductive material layer unconverted. Optionally, the step of converting the portion of the conductive material layer into the light shielding layer is performed by a plasma treatment, e.g., an oxidative plasma treatment in an oxygen-containing atmosphere. Patterns corresponding to the first source electrode layer, the first drain electrode layer, and the light shielding layer are formed in a single process. Optionally, the conductive material layer is a metallic material layer, the plasma treatment is an oxidative plasma treatment. Subsequent to the oxidative plasma treatment, the light shielding layer is formed to include an oxidative plasma-treated metallic material, which is an insulating material. Optionally, the light shielding layer is formed to be spaced apart from the first source electrode layer and the first drain electrode layer, and is insulating at least in portions in contact with the active layer to be formed. Optionally, substantially an entirety of the light shielding layer is insulating. Optionally, the oxidative plasma-treated metallic material is a substantially non-transparent insulating metal oxide material.

In some embodiments, subsequent to forming the light shielding layer, the active layer is formed on the light shielding layer, and is formed to be in direct contact with the light shielding layer. The light shielding layer is formed to cover at least the channel part of the active layer.

In some embodiments, subsequent to forming the light shielding layer, the method further includes forming an insulating film on the light shielding layer, and the active layer is formed on a side of the insulating film distal to the light shielding layer. The active layer and the light shielding layer are further insulated by the insulating film.

In some embodiments, each of the first source electrode layer and the first drain electrode layer is made of M1, M1 being a metal or an alloy, each of the second source electrode layer and the second drain electrode layer is made of M2, M2 being a metal or an alloy, and the light shielding layer is formed to include M1Ox, which is a substantially non-transparent insulating metal oxide material. Optionally, M1 and M2 are the same. Optionally, M1 includes one or a combination of copper, silver, and manganese. Optionally, M2 includes one or a combination of copper, silver, manganese, aluminum, molybdenum, chromium, neodymium, nickel, tantalum, and tungsten.

In some embodiments, the insulating layer is formed on a base substrate.

In some embodiments, the insulating layer is a base substrate of the substrate, and the via is formed to extend only partially into the insulating layer.

Optionally, the substrate is a display substrate, e.g., an array substrate. Optionally, forming the display substrate includes forming an array of a plurality of thin film transistor.

Figure 7A:
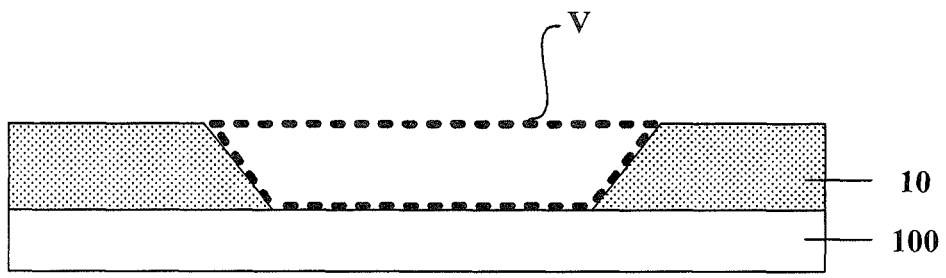
FIGS. 7A to 7L illustrate a process of fabricating a substrate for an electronic device in some embodiments according to the present disclosure.
Figure 7B:
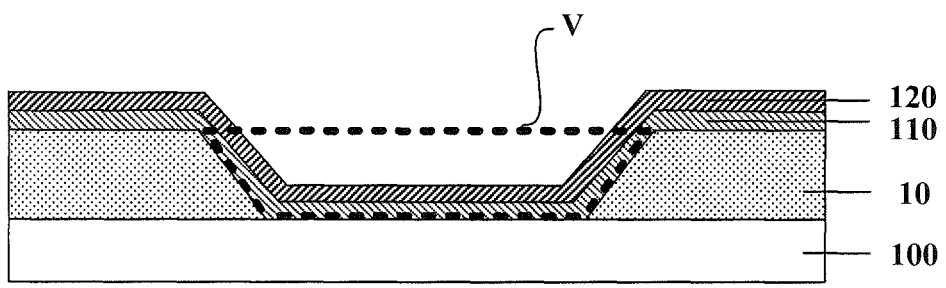
Figure 7C:
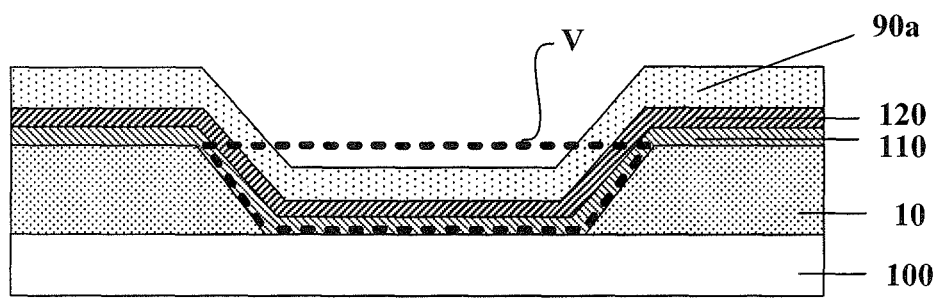

FIGS. 7A to 7L illustrate a process of fabricating a substrate for an electronic device in some embodiments according to the present disclosure. Referring to FIG. 7A, an insulating layer 10 is formed on a base substrate 100, and a via V is formed to extend into the insulating layer 10, e.g., extending through the insulating layer 10. Referring to FIG. 7B, a first conductive material layer 110 is formed on a side of the insulating layer 10 distal to the base substrate 100, and a second conductive material layer 120 is formed on a side of the first conductive material layer 110 distal to the insulating layer 10. Referring to FIG. 7C, a first photoresist layer 90a is formed on a side of the second conductive material layer 120 distal to the first conductive material layer 110. The first photoresist layer 90a, the first conductive material layer 110, and the second conductive material layer 120 are formed both in a region inside the via V and in a region outside the via V.

Figure 7D:
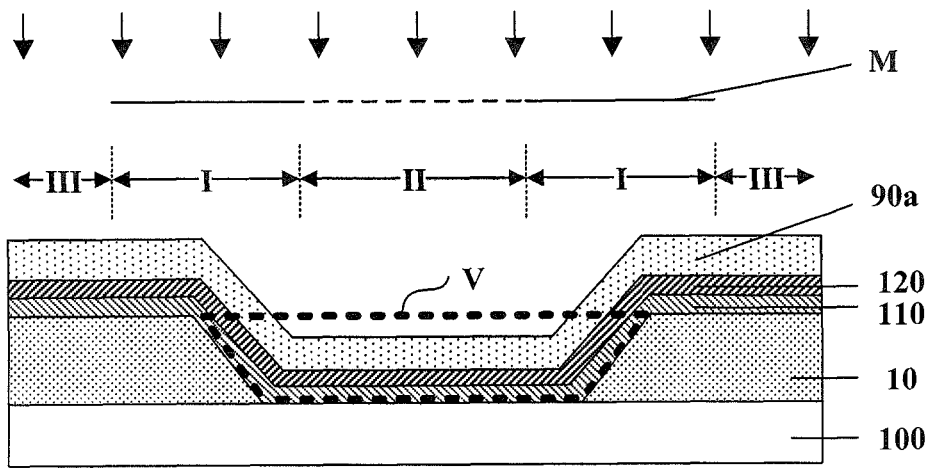

Referring to FIG. 7D, the first photoresist layer 90a is exposed with a half-tone mask plate or a gray-tone mask plate M. The half-tone mask plate or gray-tone mask plate M includes a light transmissive region, a light blocking region, and a semi-transmissive region. The exposed photoresist is developed to obtain a photoresist pattern having a first section I corresponding to the source electrode and the drain electrode, a second section II corresponding to the light shielding layer, and a third section III outside of the first section I and the second section II, the third section III being fully exposed, the first section I being substantially unexposed, the second section II being partially exposed, and the photoresist material being removed in the third section III.

Figure 7E:
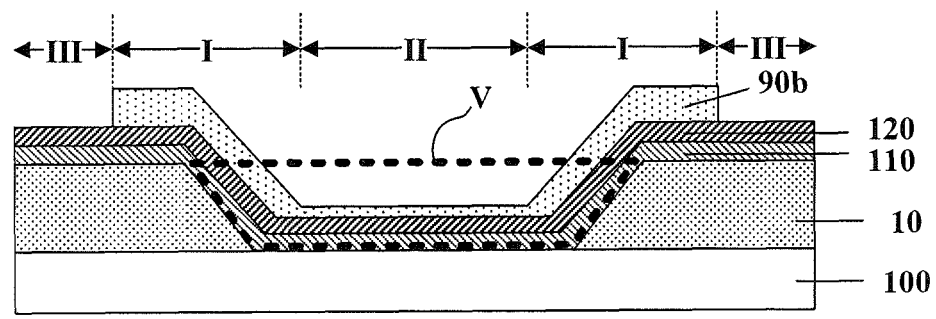

Referring to FIG. 7E, the photoresist material is removed in the third section III, and a thickness of the photoresist material in the first section I and the second section U is reduced, thereby forming a second photoresist layer 90b.

Figure 7F:
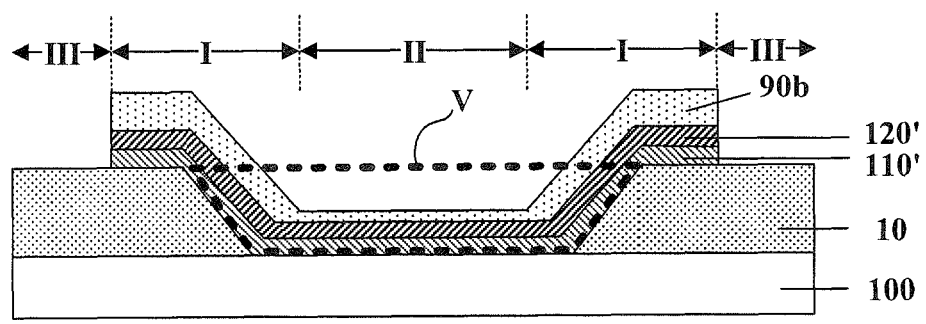

Referring to FIG. 7F, conductive materials of the first conductive material layer 110 and the second conductive material layer 120 in the third section 11 are removed, thereby forming a third conductive material layer 110' and a fourth conductive material layer 120'.

Figure 7G:
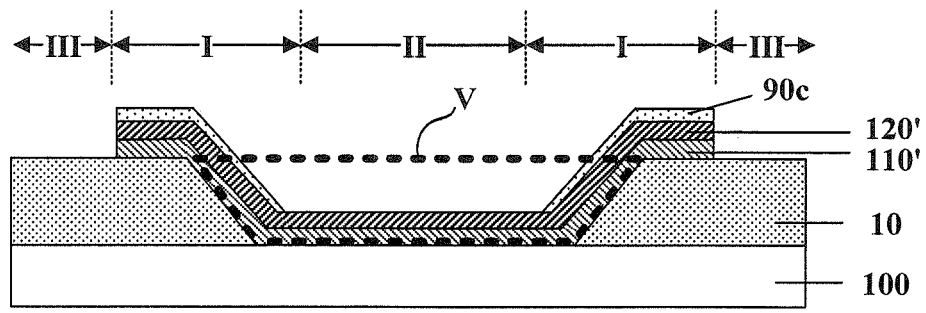

Referring to FIG. 7G, the photoresist material in the second section II is removed while the photoresist material in the first section I is maintained, thereby exposing the fourth conductive material layer 120' in the second section II.

Figure 7H:
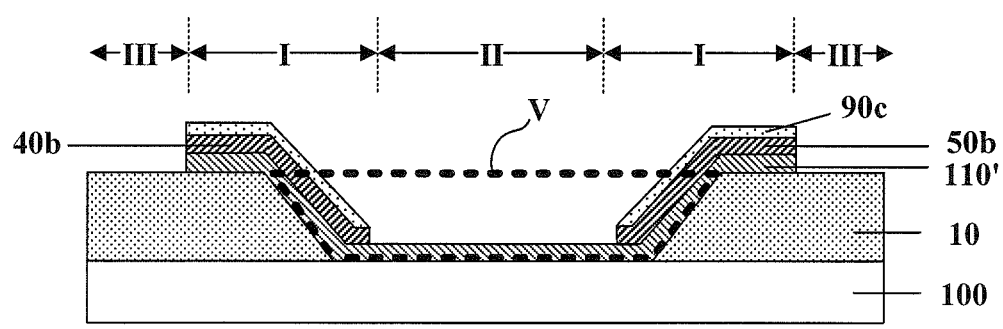

Referring to FIG. 7H, the exposed conductive material in the second section U is then etched, however, at least some conductive materials of a certain thickness is maintained in the second section II. For example, the conductive material of the fourth conductive material layer in the second section II is completely removed, thereby forming the second source electrode layer 40b and the second drain electrode layer 50b. The third conductive material layer 110' is exposed in the second section II.

Figure 7I:
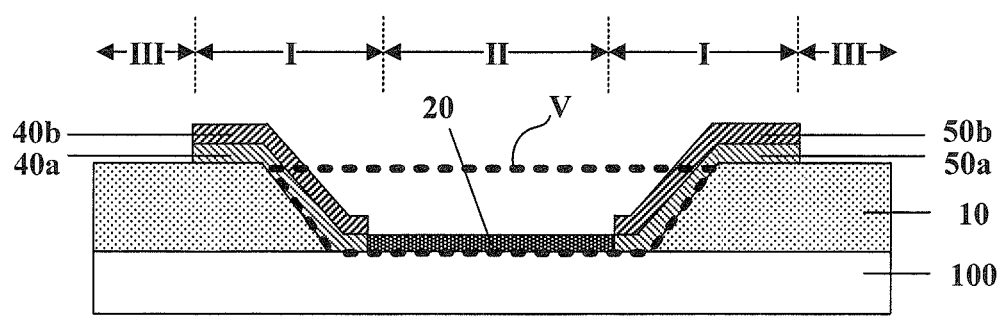

Referring to FIG. 7I, the exposed conductive material of the third conductive material layer 110' is treated with an oxidative plasma treatment, oxidizing the conductive material in the second section II into non-transparent metal oxide, thereby forming the light shielding layer 20 in the second section II, and the first source electrode layer 40a and the first drain electrode layer 50a in the first section I.

Figure 7J:
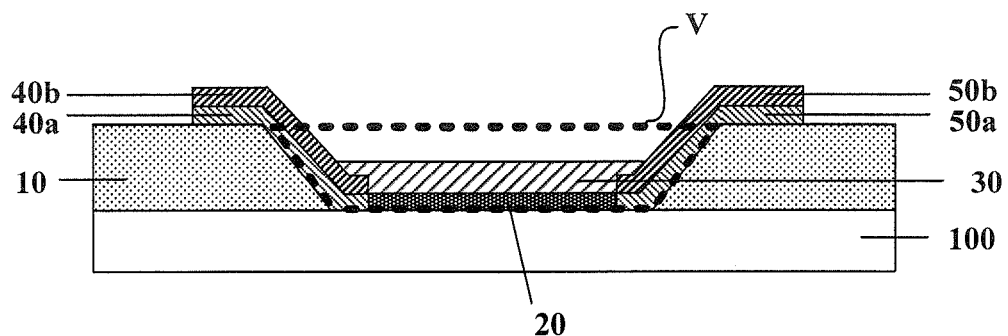

Referring to FIG. 7J, an active layer 30 is formed on a side of the light shielding layer 20 distal to the insulating layer 10.

Figure 7K:
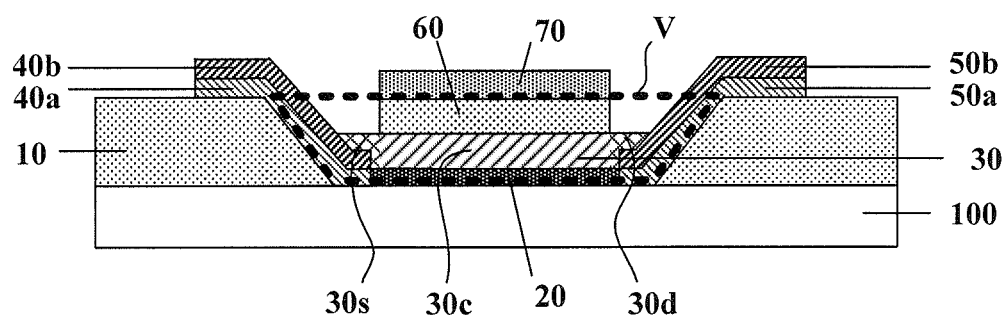

Referring to FIG. 7K, a gate insulating layer 60 is formed on a side of the active layer 30 distal to the light shielding layer 20, and a gate electrode 70 is formed on a side of the gate insulating layer 60 distal to the active layer 30. Subsequently, the active layer 30 can be doped, using the gate electrode 70 and the gate insulating layer 60 as a mask plate for the doping process, thereby forming a channel part 30c, a source electrode contact part 30s, and a drain electrode contact part 30d. At least a portion of the source electrode contact part 30s is formed on a side of the second source electrode layer 40b distal to the first source electrode layer 40a. At least a portion of the drain electrode contact part 30d is on a side of the second drain electrode layer 50b distal to the first drain electrode layer 50sa.

Figure 7L:
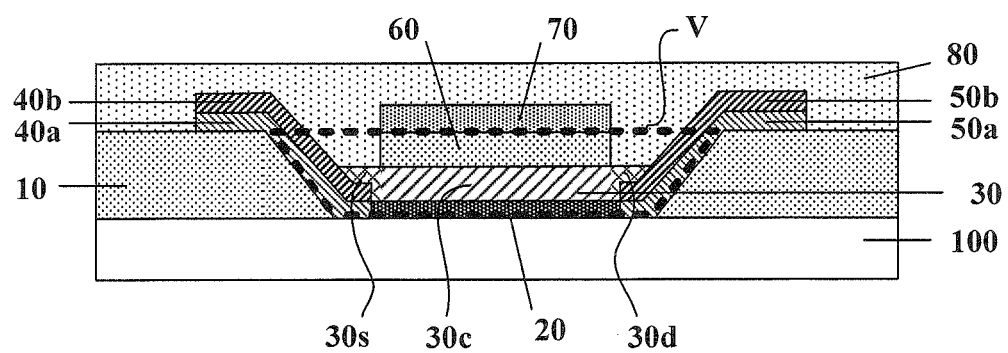

Referring to FIG. 7L, a passivation layer 80 is formed on a side of the gate electrode 70, the second source electrode layer 40b, and the second drain electrode layer 50b distal to the base substrate 100.

The present fabrication method requires only six mask plates in total whereas a conventional fabrication method for making a substrate typically requires at least eight mask plates. The present fabrication method thus provides a simplified method of fabricating a substrate.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant n their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A substrate for an electronic device, comprising:
an insulating layer;
a via extending into the insulating layer; a light shielding layer in the via; and
a thin film transistor comprising an active layer on the light shielding layer and in the via;
wherein the light shielding layer is configured to shield light from irradiating on the active layer;
wherein the thin film transistor further comprises a source electrode and a drain electrode respectively connected to the active layer;
the source electrode comprises a first source electrode layer and a second source electrode layer; and
the drain electrode comprises a first drain electrode layer and a second drain electrode layer;

wherein the first source electrode layer and the first drain electrode layer are respectively on the insulating layer, each of which at least partially inside the via;

the second source electrode layer is on a side of the first source electrode layer distal to the insulating layer; and the second drain electrode layer is on a side of the first drain electrode layer distal to the insulating layer;

wherein the first source electrode layer, the first drain electrode layer, and the light shielding layer are in a same layer.

2. The substrate of claim 1, wherein the first source electrode layer, the first drain electrode layer, and the light shielding layer have a substantially same thickness.

3. The substrate of claim 1, wherein the active layer comprises a channel part, a source electrode contact part, and a drain electrode contact part;

at least a portion of the source electrode contact part is on a side of the second source electrode layer distal to the first source electrode layer; and at least a portion of the drain electrode contact part is on a side of the second drain electrode layer distal to the first drain electrode layer.

4. The substrate of claim 1, wherein the first source electrode layer and the first drain electrode layer comprise a conductive material; and the light shielding layer comprises at least one element in common with the conductive material.

5. The substrate of claim 4, wherein the light shielding layer is converted from the conductive material by a plasma treatment, and patterns corresponding to the first source electrode layer, the first drain electrode layer, and the light shielding layer are formed in a single process.

6. The substrate of claim 5, wherein the first source electrode layer and the first drain electrode layer comprise a metallic material;

the light shielding layer comprises an oxidative plasma-treated metallic material;

the oxidative plasma-treated metallic material is an insulating material; and the first source electrode layer and the first drain electrode layer are insulated from each other.

7. The substrate of claim 6, wherein the oxidative plasma-treated metallic material comprises a substantially non-transparent insulating metal oxide material.

8. The substrate of claim 1, wherein the light shielding layer is in direct contact with at least a channel part of the active layer, and covers at least the channel part of the active layer.

9. The substrate of claim 1, further comprising an insulating film between the active layer and the light shielding layer.

10. The substrate of claim 1, wherein each of the first source electrode layer and the first drain electrode layer comprises M1, M1 being a metal or an alloy;

each of the second source electrode layer and the second drain electrode layer comprises M2, M2 being a metal or an alloy; and the light shielding layer comprises M1Ox, which is a substantially non-transparent insulating metal oxide material.

11. The substrate of claim 10, wherein M1 and M2 are the same.

12. The substrate of claim 10, wherein M1 comprises one or a combination of copper, silver, and manganese; and M2 comprises one or a combination of copper, silver, manganese, aluminum, molybdenum, chromium, neodymium, nickel, tantalum, and tungsten.

13. The substrate of claim 1, wherein the substrate is a display substrate comprising a plurality of subpixels; and an individual one of the plurality of subpixels comprises the thin film transistor and the light shielding layer.

14. A display apparatus, comprising the display substrate of claim 13.

15. A method of fabricating a substrate for an electronic device, comprising:

forming an insulating layer;

forming a via extending into the insulating layer;

forming a light shielding layer in the via;

forming a thin film transistor;

wherein forming the thin film transistor comprises forming an active layer on the light shielding layer and in the via; and wherein forming the thin film transistor further comprises forming a source electrode and a drain electrode respectively connected to the active layer;

the source electrode comprises forming a first source electrode layer and a second source electrode layer; and the drain electrode comprises forming a first drain electrode layer and a second drain electrode layer;

wherein the first source electrode layer and the first drain electrode layer are respectively formed on the insulating layer, each of which at least partially inside the via;

the second source electrode layer is formed on a side of the first source electrode layer distal to the insulating layer; and the second drain electrode layer is formed on a side of the first drain electrode layer distal to the insulating layer;

wherein the first source electrode layer, the first drain electrode layer, and the light shielding layer are formed in a same layer.

* * * * *